US010302824B2

(12) United States Patent
Kim et al.

(10) Patent No.: US 10,302,824 B2
(45) Date of Patent: May 28, 2019

(54) METHOD OF PREPARING LIGHT SCATTERING LAYER

(71) Applicants: CORNING PRECISION MATERIALS CO., LTD., Asan-si, Chungcheongnam-do (KR); SAMSUNG ELECTRONICS CO., LTD., Suwon-si, Gyeonggi-do (KR)

(72) Inventors: Seohyun Kim, Suwon-si (KR); Gunsang Yoon, Seoul (KR); Yunyoung Kwon, Goyang-si (KR); Kyungwook Park, Seoul (KR)

(73) Assignees: CORNING PRECISION MATERIALS CO., LTD., Asan-si, Chungcheongman-Do (KR); SAMSUNG ELECTRONIC CO., LTD., Suwon-si, Gyeonggi-Do (KR)

( * ) Notice: Subject to any disclaimer, the term of this patent is extended or adjusted under 35 U.S.C. 154(b) by 240 days.

(21) Appl. No.: 15/109,804

(22) PCT Filed: Jan. 2, 2015

(86) PCT No.: PCT/KR2015/000015
§ 371 (c)(1),
(2) Date: Jul. 5, 2016

(87) PCT Pub. No.: WO2015/102427
PCT Pub. Date: Jul. 9, 2015

(65) Prior Publication Data
US 2016/0327698 A1 Nov. 10, 2016

(30) Foreign Application Priority Data

Jan. 2, 2014 (KR) .................. 10-2014-0000405

(51) Int. Cl.
*H01L 29/08* (2006.01)
*G02B 5/02* (2006.01)
(Continued)

(52) U.S. Cl.
CPC .......... *G02B 5/0268* (2013.01); *C03C 17/253* (2013.01); *C03C 17/256* (2013.01);
(Continued)

(58) Field of Classification Search
CPC .................................................. G02B 5/0268
(Continued)

(56) References Cited

U.S. PATENT DOCUMENTS 4,921,731 A * 5/1990 Clark ................... C03C 17/23
427/314
5,133,988 A 7/1992 Nire et al.
(Continued)

FOREIGN PATENT DOCUMENTS

JP 2002-260844 A 9/2002
JP 2006-222028 A 8/2006
(Continued)

OTHER PUBLICATIONS

International Search Report and Written Opinion dated Mar. 30, 2015 issued in International Patent Application No. PCT/KR2015/000015.
Korean Office Action dated Sep. 23, 2016 issued in Korean Patent Application No. 10-2014-0000405 (with English translation).

*Primary Examiner* — Ajay Arora
(74) *Attorney, Agent, or Firm* — McDermott Will & Emery LLP

(57) ABSTRACT

Provided is a method of preparing a light scattering layer including voids as a light scattering enhancer instead of metal oxide particles. Provided is also a light scattering layer including voids as a light scattering enhancer instead of metal oxide particles. Provided is also an organic electroluminescent device including the light scattering layer that includes voids as the light scattering enhancer instead of metal oxide particles.

9 Claims, 2 Drawing Sheets

(51) Int. Cl.
*H01L 51/52* (2006.01)
*C03C 17/25* (2006.01)

(52) U.S. Cl.
CPC ......... *G02B 5/0247* (2013.01); *G02B 5/0278* (2013.01); *H01L 51/5268* (2013.01); *C03C 2218/116* (2013.01)

(58) Field of Classification Search
USPC ........................................................ 257/40
See application file for complete search history.

(56) References Cited

U.S. PATENT DOCUMENTS

| | | | |
|---|---|---|---|
| 2002/0134300 A1* | 9/2002 | Beach .................... | C21D 8/12 117/3 |
| 2005/0231106 A1 | 10/2005 | Tanaka et al. | |
| 2008/0094548 A1 | 4/2008 | Lee et al. | |
| 2008/0199523 A1 | 8/2008 | Finnie et al. | |
| 2009/0173253 A1* | 7/2009 | Roesch ................ | B82Y 30/00 106/286.5 |
| 2009/0233105 A1* | 9/2009 | Remington, Jr. ..... | C23C 16/453 428/432 |
| 2011/0150792 A1 | 6/2011 | Shao et al. | |
| 2011/0200293 A1 | 8/2011 | Zhang et al. | |
| 2012/0119641 A1 | 5/2012 | Shi et al. | |
| 2013/0082244 A1 | 4/2013 | Heller et al. | |

FOREIGN PATENT DOCUMENTS

| | | |
|---|---|---|
| KR | 10-2004-0005493 A | 1/2004 |
| KR | 10-2011-0062236 A | 6/2011 |
| WO | 2013-033188 A1 | 3/2013 |

\* cited by examiner

[Fig. 1]
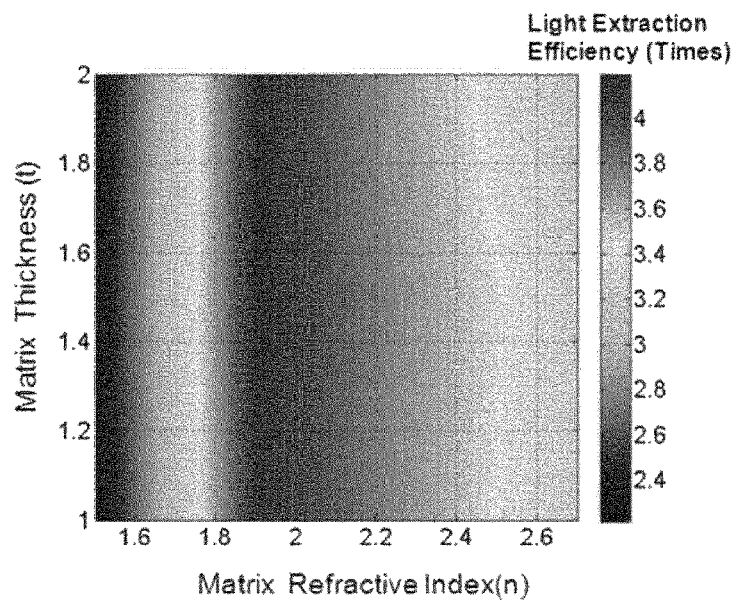
[Fig. 2]
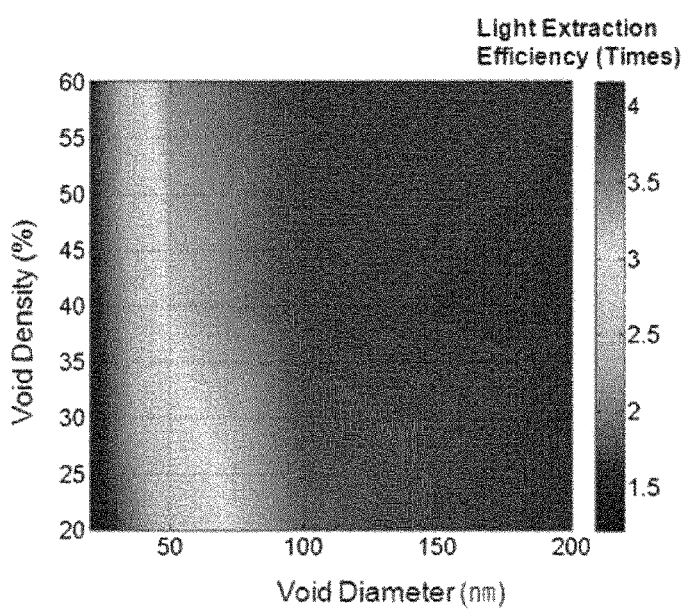
[Fig. 3]
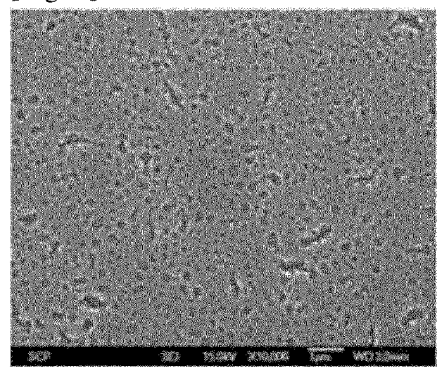

[Fig. 4]
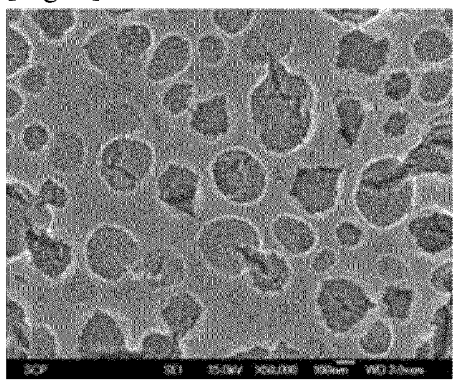

METHOD OF PREPARING LIGHT SCATTERING LAYER

RELATED APPLICATIONS

This application is the U.S. National Phase under 35 U.S.C. § 371 of International Application No. PCT/KR2015/000015, filed on Jan. 2, 2015, which in turn claims the benefit of Korean Patent Application Nos. 10-2014-0000405, filed on Jan. 2, 2014, the disclosure of which applications are incorporated by reference herein.

TECHNICAL FIELD

The present disclosure relates to methods of preparing a light scattering layer.

BACKGROUND ART

Organic electroluminescent devices used in organic electroluminescent displays are light-emitting devices including two electrodes and an emissive layer between the electrodes. In an organic electroluminescent device, electrons and holes are injected into an emissive layer through an electron injection electrode (or a cathode) and a hole injection electrode (or anode), and the electrons and holes recombine to form excitons which generate light while decaying from an exited state to a ground state.

Generally, organic electroluminescent devices have a two or three layer structure. Two-layer organic electroluminescent devices may include a hole transfer (injection) layer and an electron-transferable emissive layer. Three-layer organic electroluminescent devices may include a hole transfer (injection) layer, an emissive layer, and an electron transfer (injection) layer.

One of main tasks relating to organic electroluminescent devices is to improve efficiency when extracting light from an emissive layer. In an organic electroluminescent device, some of the light generated in an emissive layer and exiting from the emissive layer at an exit angle equal to or greater than a critical angle is totally reflected according to the refractive index of the emissive layer, and thus may not be extracted from the emissive layer. For example, if the refractive index of an emissive layer is 1.6, only about 20% of the light generated in the emissive layer may be extracted from the emissive layer.

Light scattering layers including light scattering particles have been introduced to improve light-extracting efficiency. For example, an optical waveguide layer disposed between a glass substrate and an emissive layer and including white fine particles dispersed in a transparent polymer matrix has been introduced (Japanese Patent Application Publication No. 2002-260844). In another example, an optical waveguide is disposed between a glass substrate and an emissive layer, wherein the optical waveguide includes transparent fine particles dispersed in a transparent polymer matrix and having a refractive index different from that of the transparent polymer matrix (Japanese Patent Application Publication No. 2002-260844).

Metal oxide particles may be used as light scattering particles. When metal oxide particles are dispersed into a matrix of a light scattering layer, the refractive index of the light scattering layer may be changed. In addition, light may be scattered at boundaries between the matrix of the light scattering layer and the metal oxide particles. However, it is difficult to disperse metal oxide particles into a matrix of a light scattering layer. That is, metal oxide particles are not easily dispersed into a matrix of a light scattering layer. Thus, it is difficult to include metal oxide particles in a matrix of a light scattering layer at a high concentration (for example at a high concentration in vol %). The adhesion between metal oxide particles and a matrix of a light scattering layer is poor. Thus, it may be difficult to obtain a light scattering layer having desired characteristics by dispersing metal oxide particles into a matrix of the light scattering layer.

DISCLOSURE OF INVENTION

Technical Problem

Provided is a method of preparing a light scattering layer including voids as a light scattering enhancer instead of metal oxide particles.

Provided is a light scattering layer including voids as a light scattering enhancer instead of metal oxide particles.

Provided is an organic electroluminescent device including a light scattering layer, the light scattering layer including voids as a light scattering enhancer instead of metal oxide particles.

Additional aspects will be set forth in part in the description which follows and, in part, will be apparent from the description, or may be learned by practice of the presented embodiments.

Solution to Problem

According to an aspect of the present invention, a method of preparing a light scattering layer includes: obtaining an emulsion by dispersing droplets of a second phase into a first phase including a hydrophobic metal oxide sol, the second phase including a droplet supporting material and a hydrophilic liquid; forming an emulsion layer by casting the emulsion on a substrate; converting the emulsion layer into a matrix precursor layer by baking the emulsion layer and thus solidifying the first phase, the matrix precursor layer including a plurality of voids formed owing to the droplets of the second phase; and converting the matrix precursor layer into a metal oxide matrix layer by calcining the matrix precursor layer, the metal oxide matrix layer including a plurality of voids derived from the droplets of the second phase.

According to another aspect of the present invention, a light scattering layer includes a metal oxide matrix layer in which a plurality of voids are formed, the light scattering layer being formed by the method mentioned above.

According to another aspect of the present invention, an organic electroluminescent device includes: a transparent substrate; the above-described light scattering layer disposed on the transparent substrate; a first electrode which is transparent and disposed on the light scattering layer; an organic emissive layer disposed on the first electrode; and a second electrode disposed on the organic emissive layer.

BRIEF DESCRIPTION OF DRAWINGS

These and/or other aspects will become apparent and more readily appreciated from the following description of the embodiments, taken in conjunction with the accompanying drawings in which:

FIG. 1 shows simulation results on the light extraction efficiency of an organic electroluminescent device including a light scattering layer that includes a metal oxide matrix layer, wherein a plurality of 400-nm-diameter spherical voids are formed, and the fraction of the voids in the light scattering layer is 30 vol %. FIG. 1 shows the light extraction efficiency of the organic electroluminescent device with respect to the absolute refractive index (under standard conditions: 25° C. and 1 atm) of a metal oxide matrix of the light scattering layer and the thickness (m) of the light scattering layer;

FIG. 2 shows simulation results on the light extraction efficiency of an organic electroluminescent device including a light scattering layer that includes a metal oxide matrix layer, wherein a plurality of voids are formed, and the metal oxide matrix layer includes a metal oxide matrix material having an refractive index of 2.0, and the light scattering layer has a thickness of 1.0 µm. FIG. 2 shows the light extraction efficiency of the organic electroluminescent device with respect to the average diameter (nm) of the voids included in the light scattering layer and the void density (vol %) of the light scattering layer;

FIG. 3 is an image of a light scattering layer of Example 2 captured using an electron microscope; and FIG. 4 is an enlarged view of the light scattering layer of FIG. 3.

BEST MODE FOR CARRYING OUT THE INVENTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

A method of preparing a light scattering layer will now be described according to an embodiment of the present invention. The method of the embodiment of the present invention includes: obtaining an emulsion by dispersing droplets of a second phase into a first phase including a hydrophobic metal oxide sol, the second phase including a droplet supporting material and a hydrophilic liquid; forming an emulsion layer by casting the emulsion on a substrate; converting the emulsion layer into a matrix precursor layer by baking the emulsion layer and thus solidifying the first phase, the matrix precursor layer including a plurality of voids derived from the droplets of the second phase; and converting the matrix precursor layer into a metal oxide matrix layer by calcining the matrix precursor layer, the metal oxide matrix layer including a plurality of voids derived from the droplets of the second phase.

In the embodiment of the present invention, a hydrophobic metal oxide sol is used. The hydrophobic metal oxide sol is immiscible with the hydrophilic liquid.

A metal oxide such as a transparent metal oxide may be used. Non-limiting examples of the transparent metal oxide may include $TiO_2$, $SnO_2$, $Al_2O_3$, ZnO, $ZrO_2$, $BaTiO_3$, MgO, $MnO_2$, and a combination thereof.

The hydrophobic metal oxide sol may include a dispersion medium such as $H_2O$, $H_2O_2$, methanol, ethanol, butanol, diethanolamine, or a combination thereof, but the dispersion medium is not limited thereto. It may be worth noting that although some of the listed dispersion media are hydrophilic, the metal oxide sol including such a dispersion medium may be hydrophobic.

The hydrophobic metal oxide sol may include, for example, about 1 wt % to about 70 wt % of the metal oxide. For example, the hydrophobic metal oxide sol may include about 5 wt % to about 50 wt % of the metal oxide. In another example, the hydrophobic metal oxide sol may include about 10 wt % to about 30 wt % of the metal oxide. However, the amount of the metal oxide in the hydrophobic metal oxide sol is not limited thereto.

In another embodiment of the present invention, the hydrophobic metal oxide sol may be a reaction mixture including a metal oxide precursor and a liquid oxidizer. As the metal oxide precursor and the liquid oxidizer are mixed with each other, the metal oxide precursor is converted into the metal oxide. Then, the residual liquid oxidizer serves as a main component of a dispersion medium for the metal oxide. Therefore, the reaction mixture including the metal oxide precursor and the liquid oxidizer becomes a metal oxide sol in which metal oxide particles are dispersed in a dispersion medium including the liquid oxidizer. The reaction mixture including the metal oxide precursor and the liquid oxidizer may be hydrophobic.

Non-limiting examples of the metal oxide precursor may include precursors of $TiO_2$, precursors of $SnO_2$, precursors of $Al_2O_3$, precursors of ZnO, precursors of $ZrO_2$, precursors of $BaTiO_3$, precursors of MgO, precursors of $MnO_2$, and a combination thereof.

Specifically, non-limiting examples of the metal oxide precursor may include tin tetrachloride, monomethyltin trichloride, tetramethyl tin, tin ethylhexanoate, trimethyl aluminum, trichloroalumane hexahydrate, aluminum sec-butoxide, diethylzinc, zinc acetate, zinc nitrate, tetrabutylorthotitanate, titanium isopropoxide, or a combination thereof.

Non-limiting examples of the liquid oxidizer may include $H_2O$, $H_2O_2$, ethanol, methanol, butanol, ethyl acetoacetate, or a combination thereof.

In a non-limiting example, about 100 parts by weight to about 1,000 parts by weight of the liquid oxidizer may be used based on 100 parts by weight of the metal oxide precursor.

In another embodiment of the present invention, the reaction mixture including the metal oxide precursor and the liquid oxidizer may further include a chelating agent. The chelating agent may facilitate a reaction between the metal oxide precursor and the liquid oxidizer.

The chelating agent may include, but is not limited to, for example, diethanolamine.

In a non-limiting example, about 10 parts by weight to about 30 parts by weight of the chelating agent may be used based on 100 parts by weight of the liquid oxidizer.

Specifically, non-limiting examples of the reaction mixture including the metal oxide precursor and the liquid oxidizer may include: a reaction mixture of tetrabutylorthotitanate (as a metal oxide precursor), ethanol (as a liquid oxidizer), and diethanolamine (as a chelating agent); a reaction mixture of Sn(II)-ethylhexanoate (as a metal oxide precursor) and butanol (as a liquid oxidizer); a reaction mixture of titanium tetraisopropoxide (as a metal oxide precursor) and ethyl acetoacetate (as a liquid oxidizer); and a reaction mixture of tetraethoxy silane (as a metal oxide precursor) and $H_2O$ (as a liquid oxidizer).

The first phase including the hydrophobic metal oxide sol functions as a dispersion medium in which hydrophilic droplets of the second phase are dispersed.

The hydrophilic liquid of the second phase is immiscible with the first phase which is hydrophobic. The hydrophilic liquid may be water, an alcohol compound, or a mixture thereof. The alcohol compound may be, for example, ethanol, isopropyl alcohol, or a mixture thereof.

The droplet supporting material has a function of forming and maintaining droplets of the hydrophilic liquid. For example, the droplet supporting material may be a polymer material having a glass transition temperature higher than the boiling point of the hydrophilic liquid. For example, the droplet supporting material may be polyethylene glycol, polyethylene, or a combination thereof.

The second phase may be obtained by mixing the hydrophilic liquid and the droplet supporting material. For example, the second phase may include about 5 parts by weight to about 50 parts by weight of the droplet supporting material based on 100 parts by weight of the hydrophilic liquid.

If the first and second phases are mixed and agitated, the droplet supporting material functions as nuclei for forming and maintaining droplets of the hydrophilic liquid (that is, droplets of the second phase). In this way, droplets of the second phase may be dispersed into the first phase. That is, an emulsion in which droplets of the second phase are dispersed in the first phase is obtained. When the preparation of the light scattering layer is completed, the total volume of voids of the light scattering layer is determined in proportional to the amount of the second phase included in the emulsion. Based on this, the amount of the second phase in the emulsion may be selected. For example, the emulsion may include about 1 part by weight to about 20 parts by weight of the second phase based on 100 parts by weight of the first phase.

The size and shape of the droplets of the second phase have a dominant influence on the size and shape of the voids of the light scattering layer. For example, the droplets of the second phase may have a sphere, ellipse, or disk shape. The droplets of the second phase may have a size in the range of about 50 nm to about 1,000 nm. The size and shape of the droplets of the second phase may be varied according to the concentration of the droplet supporting material and the concentration of the hydrophilic liquid in the second phase.

The emulsion layer may be formed by casting the emulsion on a substrate. The substrate may be any kind of substrate. For example, the substrate may be a glass, polymer, or metal substrate. The emulsion may be cast on the substrate by any coating method. Examples of the coating method may include a spray method, a painting method, a spin coating method, a bar coating method, and a dip coating method.

The first phase may be solidified by baking the emulsion layer. In a baking process, the emulsion layer may be heated to a temperature of, for example, about 80° C. to about 150° C. During the baking process, a substantial portion of the metal oxide precursor is converted into a metal oxide by the oxidizer. In addition, during the baking process, the dispersion medium of the metal oxide sol and the hydrophilic liquid are removed. As a result, the emulsion layer is solidified to form a matrix precursor layer. It may be worth noting that regions occupied by the droplets of the second phase are converted into voids. Therefore, after solidification, a plurality of voids formed from the droplets of the second phase may remain in the matrix precursor layer. While the metal oxide precursor is converted into the metal oxide by the oxidizer, since the dispersion medium and the hydrophilic liquid are removed, the voids remaining in the matrix precursor layer may have substantially the same size and shape as the size and shape of the droplets of the second phase.

The matrix precursor layer may be calcined so as to convert the matrix precursor layer into the metal oxide matrix layer including a plurality of voids derived from the droplets of the second phase. In a calcining process, the matrix precursor layer may be heated to a temperature of, for example, about 200° C. to about 600° C. During the calcining process, a remaining portion of the metal oxide precursor is converted into the metal oxide, and remaining portions of the dispersion medium and the hydrophilic liquid are removed. In addition, the droplet supporting material is removed. In this way, the matrix precursor layer may be completely converted into the metal oxide matrix layer. Here, it may be worth noting that the voids derived from the droplets of the second phase still remain in the metal oxide matrix layer. Since the metal oxide matrix layer is obtained by calcining the matrix precursor layer which is already solidified, the voids remaining in the metal oxide matrix layer may still have substantially the same size and shape as the size and shape of the droplets of the second phase.

If the droplets of the second phase are not used and only the dispersion medium of the first phase is evaporated, cylindrical voids extending from the inside to the surface of the light scattering layer may be formed. In this case, voids having a desired shape may not be obtained. In addition, the surface of the light scattering layer may be rough, and thus it may be difficult to form an indium thin oxide (ITO)/organic light emitting diode (OLED) layer on the light scattering layer. In the embodiment of the present invention, however, since the droplet supporting material has a function of forming and maintaining droplets of the hydrophilic liquid of the second phase, the shape of the voids may be maintained until the droplets of the second phase are removed.

Another aspect of the present invention provides a light scattering layer prepared by the method of the previous embodiment. The light scattering layer includes a metal oxide matrix layer in which a plurality of voids are formed.

For example, the voids may have a sphere, ellipse, or disk shape. Owing to the void, light in all directions may be refracted. That is, owing to the voids, even totally-reflected light may be refracted and extracted.

For example, the voids may have a size in the range of about 50 nm to about 300 nm. When the voids are too small, light having only a narrow wavelength range may be refracted. Likewise, when the voids are too large, light having only a narrow wavelength range may be refracted. Furthermore, if the voids are too large, the light scattering layer may become thick, and thus more light may be absorbed in the light scattering layer. Furthermore, if the voids are too large, it may be difficult to adjust the surface roughness of the light scattering layer.

For example, the light scattering layer may have a void fraction of about 5 vol % to about 40 vol %. If the void fraction is too low, only a small amount of light may be refracted. If the void fraction is too high, mechanical characteristics of the light scattering layer such as strength may be deteriorated.

For example, the light scattering layer may have a refractive index in the range of about 1.7 to about 2.4. It may be difficult to form a light scattering layer which has too low refractive index. If the refractive index of the light scattering layer is too high, a light trapping phenomenon may occur.

For example, the light scattering layer may have a thickness in the range of about 300 nm to about 2,000 nm. If the light scattering layer is too thin, it may be difficult to reduce the surface roughness of the light scattering layer. If the light scattering layer is too thick, more light may be absorbed in the light scattering layer.

Another aspect of the present invention provides an organic electroluminescent device including: a transparent substrate; the light scattering layer of the previous embodiment, the light scattering layer being disposed on the transparent substrate and including the metal oxide matrix layer in which a plurality of voids are formed; a first electrode which is transparent and disposed on the light scattering layer; an organic emissive layer disposed on the first electrode; and a second electrode disposed on the organic emissive layer.

For example, the voids may have a sphere, ellipse, or disk shape. Owing to the void, light in all directions may be refracted. That is, owing to the voids, even totally-reflected light may be refracted and extracted.

For example, the voids may have a size in the range of about 50 nm to about 300 nm.

When the voids are too small, light having only a narrow wavelength range may be refracted. Likewise, when the voids are too large, light having only a narrow wavelength range may be refracted. Furthermore, if the voids are too large, the light scattering layer may become thick, and thus more light may be absorbed in the light scattering layer. Furthermore, if the voids are too large, it may be difficult to adjust the surface roughness of the light scattering layer.

For example, the light scattering layer may have a void fraction of about 5 vol % to about 40 vol %. If the void fraction is too low, only a small amount of light may be refracted. If the void fraction is too high, mechanical characteristics of the light scattering layer such as strength may be deteriorated.

For example, the light scattering layer may have a refractive index in the range of about 1.7 to about 2.4. It may be difficult to form a light scattering layer which has too low refractive index. If the refractive index of the light scattering layer is too high, a light trapping phenomenon may occur.

For example, the light scattering layer may have a thickness in the range of about 300 nm to about 2,000 nm. If the light scattering layer is too thin, it may be difficult to reduce the surface roughness of the light scattering layer. If the light scattering layer is too thick, more light may be absorbed in the light scattering layer.

EXAMPLES

Example 1—Simulation on Light Extraction Efficiency

FIGS. 1 and 2 show results of simulations on the light extraction efficiency of the organic electroluminescent device of the embodiment of the present invention. Simulation software was "LightTools" (by Optical Research Associates, USA). In the simulation, a structure of Al layer (100 nm in thickness)/organic emissive layer (200 nm in thickness)/ITO layer (150 nm in thickness)/light scattering layer/glass layer (0.7 mm in thickness) was used as the structure of the organic electroluminescent device.

FIG. 1 shows simulation results on the light extraction efficiency of the organic electroluminescent device in the case in which the light scattering layer includes a metal oxide matrix layer in which a plurality of 400-nm-diameter spherical voids are formed, the fraction of the voids in the light scattering layer being 30-vol %. In FIG. 1, the light extraction efficiency is calculated by dividing the intensity of light emitted from the organic electroluminescent device including the light scattering layer by the intensity of light emitted from an organic electroluminescent device not including a light scattering layer (that is, having a structure of Al layer (100 nm in thickness)/organic emissive layer (200 nm in thickness)/ITO layer (150 nm in thickness)/glass layer (0.7 mm in thickness). FIG. 1 shows the light extraction efficiency of the organic electroluminescent device with respect to the absolute refractive index (measured at wavelength of 589.3 nm of the sodium spectrum D line under standard conditions: 25° C. and 1 atm) of a metal oxide matrix of the light scattering layer and the thickness (m) of the light scattering layer. In FIG. 1, the right vertical bar is a reference indicating the relationship between colors and light extraction efficiency values. As shown in FIG. 1, when the refractive index of the metal oxide matrix of the light scattering layer is within the range of about 1.9 to about 2.2 (under standards conditions: 25° C. and 1 atm), the light extraction efficiency is about 3.8 times or more, substantially regardless of the thickness of the light scattering layer.

FIG. 2 shows simulation results on the light extraction efficiency of the organic electroluminescent device in the case in which the light scattering layer includes a metal oxide matrix layer in which a plurality of voids are formed. The metal oxide matrix layer includes a metal oxide matrix material having a refractive index of 2.0, and the light scattering layer has a thickness of 1.0 μm. In FIG. 2, the light extraction efficiency is calculated by dividing the intensity of light emitted from the organic electroluminescent device including the light scattering layer by the intensity of light emitted from an organic electroluminescent device not including a light scattering layer (that is, having a structure of Al layer (100 nm in thickness)/organic emissive layer (200 nm in thickness)/ITO layer (150 nm in thickness)/glass layer (0.7 mm in thickness). FIG. 2 shows the light extraction efficiency of the organic electroluminescent device with respect to the average diameter (nm) of the voids included in the light scattering layer and the void density (vol %) of the light scattering layer. In FIG. 2, the right vertical bar is a reference indicating the relationship between colors and light extraction efficiency values. Referring to FIG. 2, when the average diameter of the voids of the light scattering layer is greater than or equal to about 100 nm, the light extraction efficiency is about 3.8 times or more, substantially regardless of the void density.

Example 2—Preparation of $TiO_2$ Light Scattering Layer

In Example 2, the following materials were used.
Metal oxide precursor: 17 g of tetrabutylorthotitanate (by Aldrich, USA)
Liquid oxidizer: 5 g of diethanolamine, 67 g of ethanol, and 5.6 g of butanol
Hydrophilic liquid: 0.9 g of deionized water
Droplet supporting material: 0.3 g of polyethylene glycol (PEG2000 by Aldrich, USA)

An emulsion layer was formed by preparing an emulsion in which droplets of a second phase (including a hydrophilic liquid and a droplet supporting material) were dispersed into a first phase (including a metal oxide precursor and a liquid oxidizer), and coating a glass substrate with the emulsion by a spin coating method. Next, the emulsion layer was baked at 150° C. for 10 minutes, and thus, the emulsion layer was solidified to form a matrix precursor layer. Next, the matrix precursor layer solidified on the glass substrate was calcined at 550° C. for 60 minutes to form a light scattering layer (having a final thickness of 0.8 μm). FIG. 3 is an image of the light scattering layer of Example 2 captured using an electron microscope. FIG. 4 is an enlarged view of the light scattering layer of FIG. 3.

Example 3—Preparation of $SnO_2$ Light Scattering Layer

In Example 3, the following materials were used.
Metal oxide precursor: 1.25 g of Sn (II)-ethylhexanoate (by Aldrich, USA)
Liquid oxidizer: 5 g of diethanolamine, 67 g of ethanol, and 5.6 g of butanol
Matrix function improver: 0.1 g of cetyltrimethylammonium bromide
Droplet supporting material: 0.3 g of polyethylene glycol (PEG2000 by Aldrich, USA)

A mixture of the metal oxide precursor, the liquid oxidizer, and the matrix function improver was agitated for 2 hours to form a first phase and water (about 1 ml). The water functioned as a hydrophilic liquid. A droplet supporting material was added to the mixture of the first phase and water and agitated to obtain an emulsion. A glass substrate was coated with the emulsion by a spin coating method to form an emulsion layer on the glass substrate. Next, the emulsion layer was baked at 150° C. for 10 minutes to solidify the emulsion layer as a matrix precursor layer. Next, the matrix precursor layer solidified on the glass substrate was calcined at 550° C. for 60 minutes to form a light scattering layer (having a final thickness of 0.8 μm).

As described above, according to the one or more embodiments of the present invention, by using voids as a light scattering enhancer instead of using metal oxide particles as a light scattering enhancer, it may be possible to solve problems caused by metal oxide particles, that is, the poor dispersion in a matrix of a light scattering layer and the poor adhesion between the metal oxide particles and the matrix of the light scattering layer.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

The invention claimed is:

1. A method of preparing a light scattering layer, the method comprising: obtaining an emulsion by dispersing droplets of a second phase into a first phase comprising a hydrophobic metal oxide sol, the second phase comprising a droplet supporting material and a hydrophilic liquid; forming an emulsion layer by casting the emulsion on a substrate; converting the emulsion layer into a matrix precursor layer by baking the emulsion layer and thus solidifying the first phase, the matrix precursor layer comprising a plurality of voids derived from the droplets of the second phase; and
converting the matrix precursor layer into a metal oxide matrix layer by calcining the matrix precursor layer, the metal oxide matrix layer comprising a plurality of voids derived from the droplets of the second phase.

2. The method of claim 1, wherein the metal oxide is $TiO_2$, $SnO_2$, $Al_2O_3$, ZnO, $ZrO_2$, $BaTiO_3$, MgO, $MnO_2$, or a combination thereof.

3. The method of claim 1, wherein the hydrophobic metal oxide sol is a reaction mixture comprising a metal oxide precursor and a liquid oxidizer.

4. The method of claim 3, wherein the metal oxide precursor comprises tin tetrachloride, monomethyltin trichloride, tetramethyl tin, tin ethyl-hexanoate, trimethyl aluminum, trichloroalumane hexahydrate, aluminum sec-butoxide, diethylzinc, zinc acetate, zinc nitrate, tetra-butylorthotitanate, titanium isopropoxide, or a combination thereof.

5. The method of claim 3, wherein the liquid oxidizer comprises $H_2O$, $H_2O_2$, ethanol, methanol, butanol, or a combination thereof.

6. The method of claim 3, wherein the reaction mixture further comprises a chelating agent.

7. The method of claim 6, wherein the chelating agent comprises diethanolamine.

8. The method of claim 1, wherein the hydrophilic liquid comprises water, an alcohol compound, or a mixture thereof.

9. The method of claim 1, wherein the droplet supporting material comprises polyethylene glycol, polyethylene, or a combination thereof.

* * * * *